United States Patent
Sasaki

(10) Patent No.: US 8,912,454 B2
(45) Date of Patent: Dec. 16, 2014

(54) SEAL STRUCTURE

(75) Inventor: Takashi Sasaki, Fujisawa (JP)

(73) Assignee: Nippon Mektron, Ltd. (JP)

( * ) Notice: Subject to any disclaimer, the term of this patent is extended or adjusted under 35 U.S.C. 154(b) by 91 days.

(21) Appl. No.: 13/698,596

(22) PCT Filed: Jun. 30, 2011

(86) PCT No.: PCT/JP2011/065065
§ 371 (c)(1),
(2), (4) Date: Nov. 16, 2012

(87) PCT Pub. No.: WO2012/008311
PCT Pub. Date: Jan. 19, 2012

(65) Prior Publication Data
US 2013/0062837 A1   Mar. 14, 2013

(30) Foreign Application Priority Data
Jul. 15, 2010  (JP) ................. 2010-160441

(51) Int. Cl.
*H05K 7/00* (2006.01)
*H04M 1/02* (2006.01)
*H04M 1/18* (2006.01)

(52) U.S. Cl.
CPC ............. *H05K 7/00* (2013.01); *H04M 1/0235* (2013.01); *H04M 1/18* (2013.01)
USPC ......... 174/650; 174/77 R; 174/50.5; 361/749; 361/752; 277/602; 277/626

(58) Field of Classification Search
CPC .................................................. H04M 1/0235
USPC ........... 174/50.5, 50.63, 539, 554, 564, 77 R, 174/152 R, 650, 524; 277/650, 602, 626, 277/627; 361/752, 814, 749; 455/575.1, 455/575.3, 550.1, 575.4
See application file for complete search history.

(56) References Cited

U.S. PATENT DOCUMENTS

| | | | | |
|---|---|---|---|---|
| 6,064,003 | A * | 5/2000 | Moore et al. | 174/662 |
| 6,521,989 | B2 * | 2/2003 | Zhou | 257/698 |
| 6,872,088 | B2 * | 3/2005 | Watanabe | 439/165 |
| 7,738,239 | B2 * | 6/2010 | Yokote et al. | 361/679.09 |
| 8,106,312 | B2 * | 1/2012 | Shinoda et al. | 174/554 |
| 8,112,129 | B2 * | 2/2012 | Shinoda et al. | 455/575.1 |
| 8,581,118 | B2 * | 11/2013 | Kasuga et al. | 174/650 |
| 2011/0000712 | A1 | 1/2011 | Kasuga et al. | |

FOREIGN PATENT DOCUMENTS

| | | |
|---|---|---|
| JP | 2006-095382 A | 4/2006 |
| JP | 3127071 U | 11/2006 |
| JP | 2010045096 A | 2/2010 |
| JP | 2010135740 A | 6/2010 |

* cited by examiner

*Primary Examiner* — Angel R Estrada
*Assistant Examiner* — Dimary Lopez Cruz
(74) *Attorney, Agent, or Firm* — Harness, Dickey & Pierce, P.L.C.

(57) ABSTRACT

Provided is a seal structure which can reduce the thickness of an electronic device, can be easily assembled and disassembles, and can exhibit an excellent seal performance. Thus, the seal structure for an electronic device, which seals a gap between a flexible wiring substrate inserted to a through-hole provided in a case member of an electronic device and the through-hole, is comprised of an annular gasket composed of a rubber elastic material, a part of which is integrally molded with the flexible wiring substrate, and a retainer plate for retaining the gasket in conjunction with the case member.

3 Claims, 7 Drawing Sheets

SEAL STRUCTURE

CROSS-REFERENCE TO RELATED APPLICATIONS

This application is a U.S. National Stage Application of International Application No. PCT/JP2011/065065, filed on Jun. 30, 2011 and published in Japanese as WO 2012/008311 on Jan. 19, 2012. This application claims the benefit of Japanese Application No. 2010-160441, filed on Jul. 15, 2010. The entire disclosures of the above applications are incorporated herein by reference.

BACKGROUND OF THE INVENTION

1. Field of the Invention

The present invention relates to a seal structure.

The present invention more particularly relates to a seal structure which provides a waterproof structure of a wiring body extending while passing through a case member of an electronic equipment such as a portable terminal, a PDA, a personal computer or the like.

2. Description of the Conventional Art

In an early portable terminal, a vertically longer tabular shape is a mainstream, however, there are a foldaway portable telephone in which a case member of the portable telephone is divided into an upper case member and a lower case member so as to be superposed, and is opened and closed around a rotation shaft which is provided in one side thereof, and a rotary type in which a rotation shaft is provided vertically to a superposing surface of a case member of a portable telephone which is divided into an upper case member and a lower case member so as to be superposed, and the upper case member is rotated at 180 degree with respect to the lower case member around the rotation shaft so as to be expanded.

Further, there is a slide type in which an upper case member is slid with respect to a lower case member, by setting a slide rail in a superposing surface or employing a tunnel structure in a case member of a portable telephone which is divided into the upper case member and the lower case member so as to be superposed.

However, in the conventional slide type portable telephone, there has been such a problem that it has a weakness for an intrusion of a liquid.

Particularly, there has been such a problem that if a liquid travels into an inner portion of the case member through a flexible wiring board for connecting the upper case member and the lower case member so as to be attached to a connecter, an electric trouble is caused.

Accordingly, as a structure which seals a through hole of a case member of an electronic equipment as shown in FIG. 9, there has been an aspect using a gasket in which bush-shaped seal members 300 and 300 are integrally formed in a flexible wiring board 200 (Japanese Utility Model No. 3127071 and Japanese Patent Republication No. 2006-095382).

However, it is necessary to seal a case member and a wiring member in a thin space between two case members within an electronic equipment such as a slide portion of a slide type portable terminal. In the case that the bush-shaped seal members 300 and 300 are used, a cross sectional area of the seal members 300 and 300 themselves can not help becoming significantly large. Therefore, a thickness of the case member of the slide type portable terminal to which the seal members 300 and 300 are fitted and fixed becomes thicker, and it is hard to arrange it in a small gap such as a slide portion of the slide type portable terminal.

Therefore, this kind of seal structure has come to a factor which obstruct a thin structure of the slide type portable terminal.

Accordingly, there has been proposed a seal structure which is provided with a space member to which a tabular wiring member is inserted, and a coating body sealing a wiring member and a spacer member, and is structured such that the coating body is constructed by a lid member opposing to the spacer member, and an adhesive agent layer occluding a gap between the spacer member and the lid member while filling in a part of the wiring member, and a step between the wiring member and the spacer member is filled with the adhesive agent layer (Japanese Unexamined Patent Publication No. 2010-135740).

However, due to a method of filling in the gasp by using the adhesive agent per the portable terminal, it has taken a lot of labor hour and time to execute, and a dispersion in quality has been brought about between the portable terminals.

Further, the method of filling in the gap generated between the wiring member and the case member with the adhesive agent or the like has caused such a problem that it becomes hard to disassemble and reassemble.

SUMMARY OF THE INVENTION

Problem to be Solved by the Invention

The present invention is made by taking the points mentioned above into consideration, and an object of the present invention is to provide a seal structure which can achieve a thin structure of an electronic equipment, can be easily assembled and disassembled and can achieve a good sealing performance.

Means for Solving the Problem

In order to achieve the object mentioned above, in accordance with the present invention, there is provided a seal structure for an electronic equipment which seals a gap between a flexible wiring board inserted to a through hole provided in a case member of the electronic equipment and the through hole, the seal structure comprising:

an annular gasket which is integrally formed a part thereof in the flexible wiring board and is made of a rubber elastic material; and a presser plate which pinches the gasket with respect to the case member.

Effect of the Invention

The present invention achieves effects as described below.

In accordance with a seal structure of an invention described in the first aspect, it is possible to achieve a thin structure of an electronic equipment, it is easy to assemble and disassemble, and a good sealing performance can be achieved.

Further, in accordance with a seal structure of an invention described in the second aspect, since a surface pressure generated in a gasket becomes uniform in all the surface, a sealing performance is good, and it is possible to enhance a water preventing performance.

Further, in accordance with a seal structure of an invention described in the third aspect, since it is possible to effectively prevent the gasket from peeling from the flexible wiring board, it is possible to achieve a good sealing performance.

Further, in accordance with a seal structure of an invention described in the fourth aspect, since it is easy to assemble, and it is possible to precisely position the gasket, it is possible to achieve a good sealing performance.

Further, in accordance with a seal structure of an invention described in the fifth aspect, it is possible to easily assemble and disassemble.

Further, in accordance with a seal structure of an invention described in the sixth aspect, it is possible to more effectively achieve the thin structure of the electronic equipment.

Further, in accordance with a seal structure of an invention described in the seventh aspect, it is possible to achieve a thin structure of a slide type portable terminal by using it in a case member in a liquid crystal side and a case member in a key pad side of a slide type portable terminal.

DETAILED DESCRIPTION OF PREFERRED EMBODIMENT

A description will be given below of an aspect for carrying out the present invention.

A description will be given of a best mode for carrying out the invention on the basis of FIG. 1 to FIG. 8.

Figure 1:
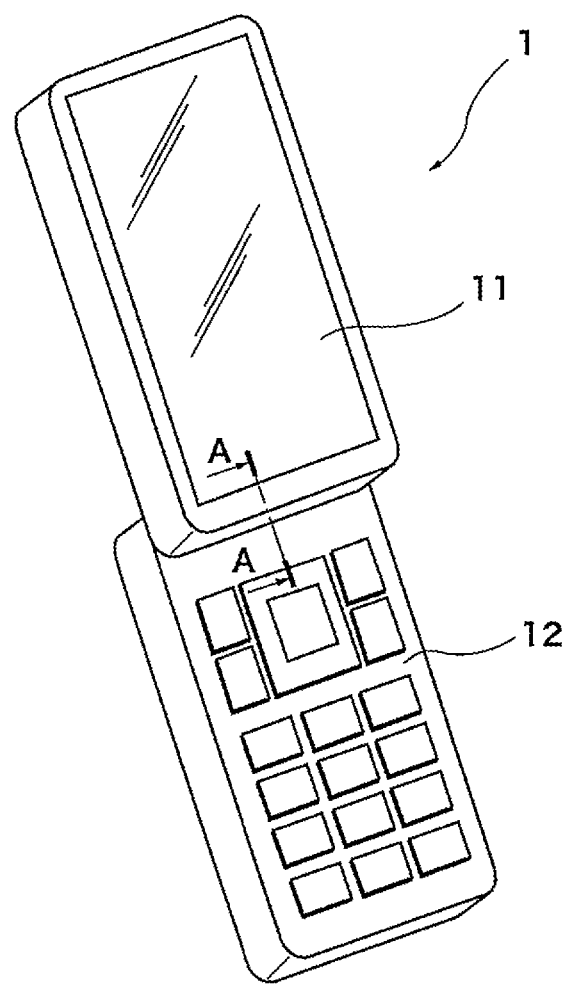
FIG. 1 is an outer appearance view of an electronic equipment to which a seal structure in accordance with the present invention is applied.

An electronic equipment to which a seal structure of the present invention is applies is structured, as shown in FIG. 1, such that a case member 1 of an electronic equipment corresponding to a slide type portable terminal is constructed by a case member 11 in a liquid crystal side, and a case member 12 in a key pad side.

Figure 2:
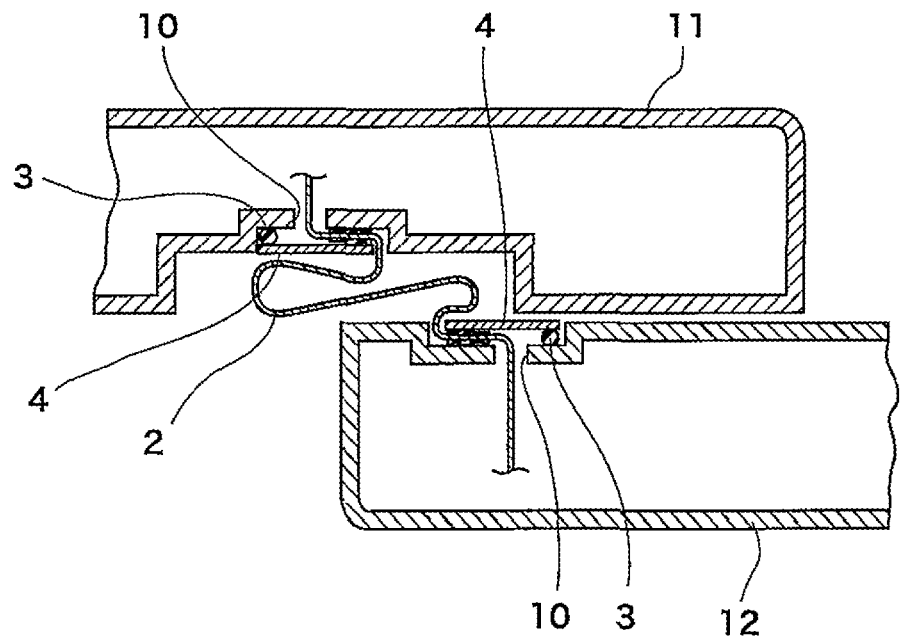
FIG. 2 is a cross sectional view along a line A-A in FIG. 1.

Further, as shown in FIG. 2, both the case members 11 and 12 are provided respectively with through holes 10 to which flexible wiring boards 2 are inserted.

Further, in order to seal a gap between the flexible wiring board 2 and the through hole 10, the seal structure of the present invention has a structure constructed by an annular gasket 3 which is integrally formed its part in the flexible wiring board 2 and is made of a rubber elastic material, and a presser plate 4 which pinches the gasket 3 with respect to the case member 1.

Figure 4:
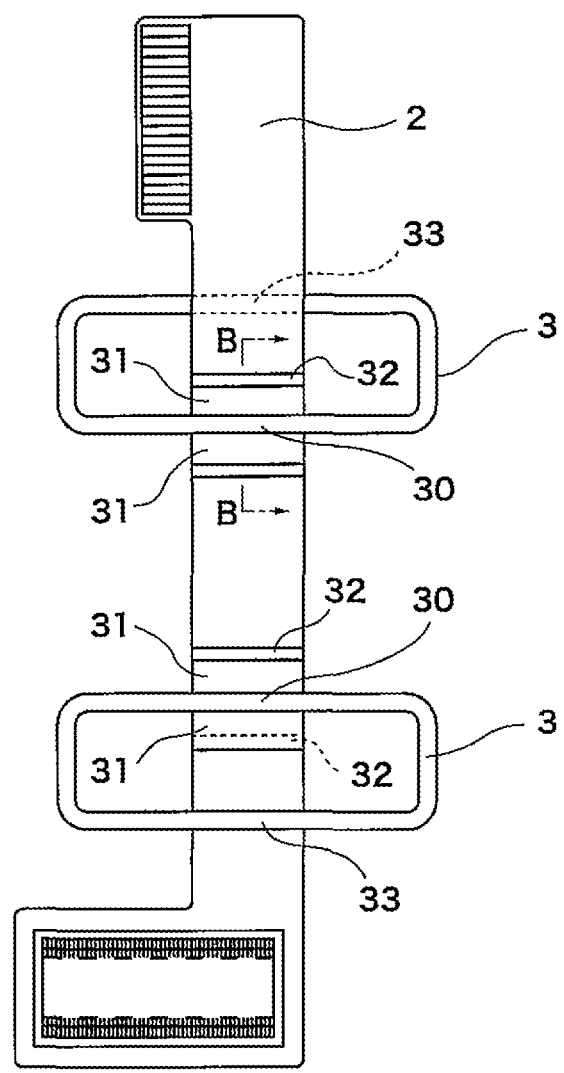
FIG. 4 is a plan view showing a state in which a gasket constructing the seal structure of the present invention is integrally formed in a flexible wiring board.
Figure 5:
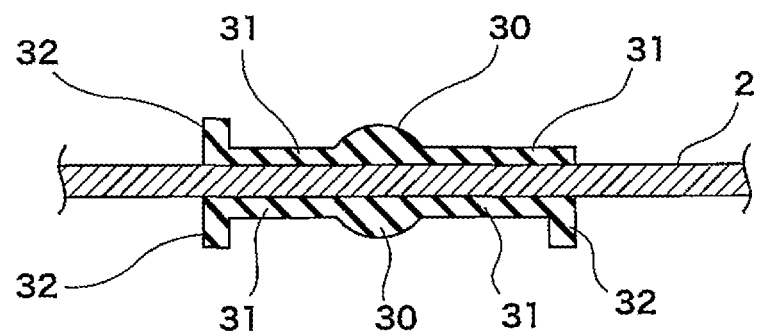
FIG. 5 is a cross sectional view along a line B-B in FIG. 4.

The gasket 3 is structured, as shown in FIG. 4, such that one position of each of two annular gaskets 3 and 3 made of the rubber elastic material is integrally formed on a surface of the flexible wiring board 2, and is structured, as shown in FIG. 5, such that a seal projection portion 30 of the gasket 3 continuously exists on both surfaces of the flexible wiring board 2, even in a region in which the gasket 3 is integrally formed in the flexible wiring board 2.

Further, in FIG. 4, one of a portion which is seen so as to lap over the flexible wiring board 2 of the gasket 3 comes to a non-adhered position 33 in a state in which it is not adhered to the flexible wiring board 2.

Accordingly, in a state in which the flexible wiring board 2 is inserted to the through hole 10, it is possible to pinch the gasket 3 between the case member 1 and the presser plate 4.

Further, since a surface pressure generated in the gasket 3 becomes uniform in all the surfaces including the region in which the gasket 3 is integrally formed in the flexible wiring board 2, a sealing performance is good and it is possible to enhance a water proofing performance.

In the present embodiment, a shape of the gasket 3 is formed as an O-ring shape, however, can be formed as such a lip shape that the seal projection portion 30 is sharp.

Figure 8:
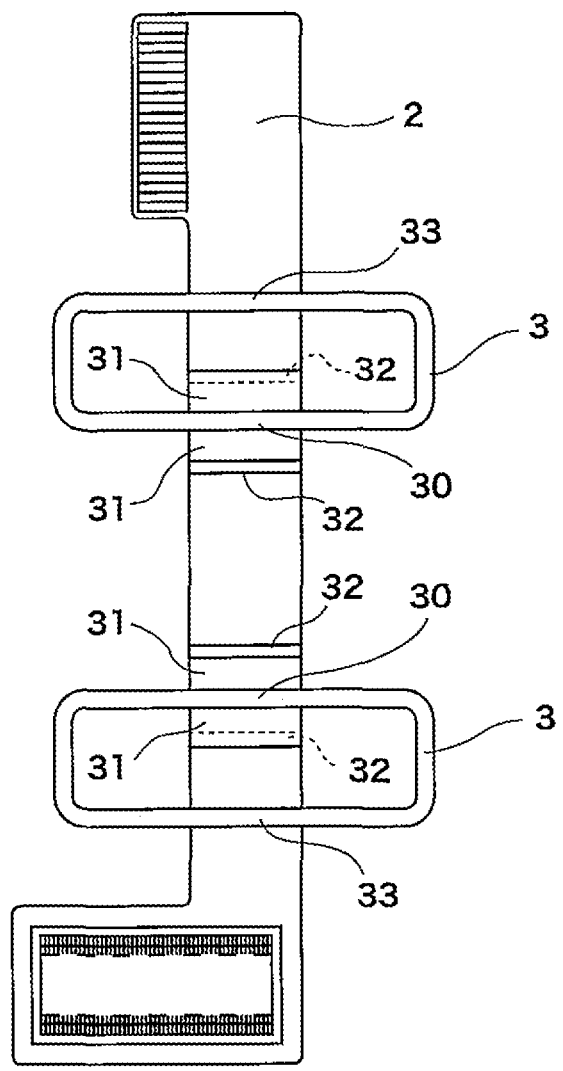
FIG. 8 is a plan view showing an aspect that non-adhered positions of two gaskets exist in the same surface side of the flexible wiring board in the same manner as FIG. 4.
Figure 9:
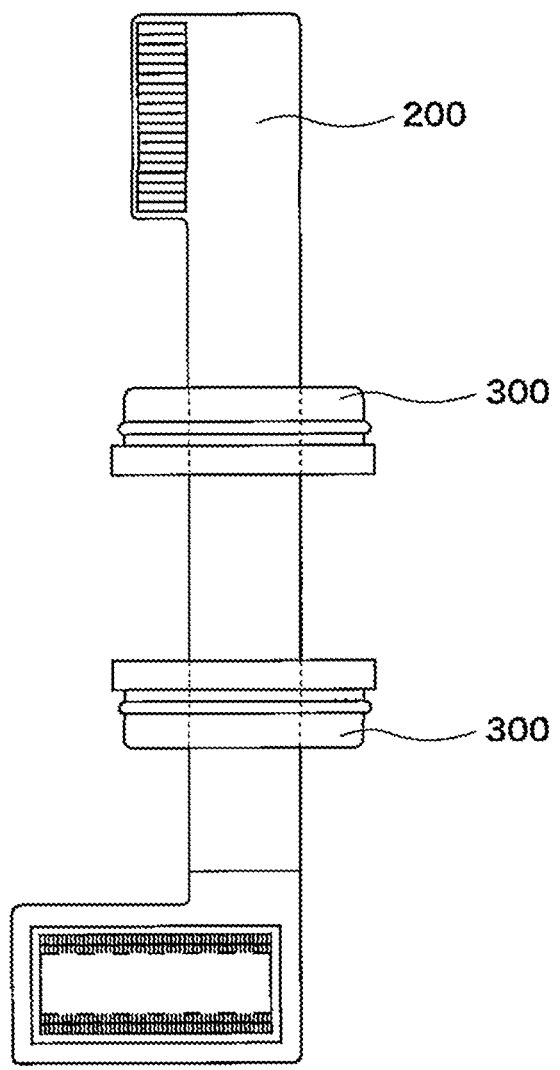
FIG. 9 is a plan view showing an aspect that a bush-shaped seal member used in a seal structure in accordance with a prior art is integrally formed in a flexible wiring board member.

Further, the non-adhered position 33 (a lower side of the drawing) of the one gasket 3 is structured such as to be positioned in a front surface side of the drawing, and the non-adhered position 33 (an upper side of the drawing) of the another gasket 3 is positioned in a back surface side of the drawing as shown by a broken line, and is formed such a shape that the flexible wiring board 2 passes through the annular gasket 3, however, the non-adhered positions 33 and 33 of both the gaskets 3 and 3 may be structured, as shown in FIG. 8, such that they are both positioned in the front surface side of the drawing.

Further, as shown in FIG. 5, the gasket 3 is provided with a burr-shaped thin portion 31 which extends from the gasket 3 in a longitudinal direction of the flexible wiring board 2, in a region in which it is integrally formed in the flexible wiring board 2.

Accordingly, it is possible to effectively prevent the gasket 3 from peeling from the flexible wiring board 2, and it is possible to achieve a good sealing performance.

Figure 3:
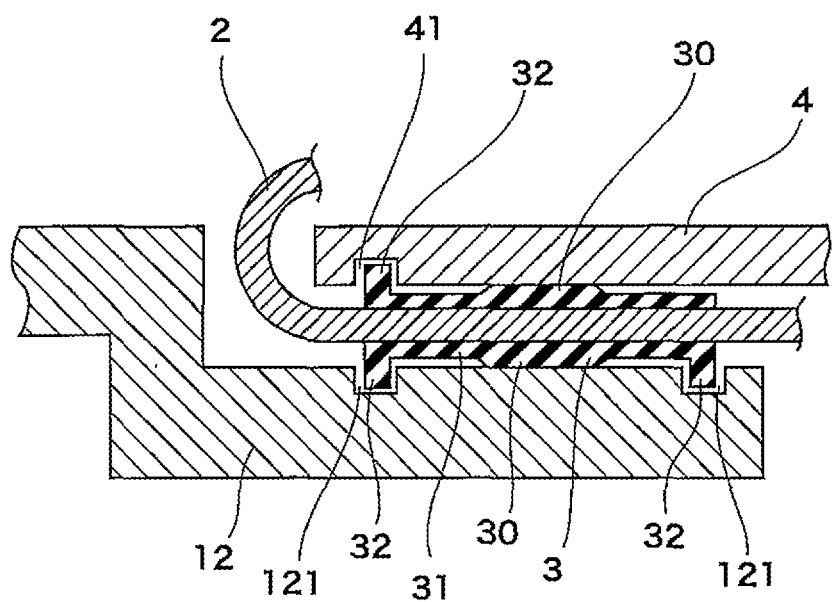
FIG. 3 is a partly enlarged view of FIG. 2.

Further, as shown in FIG. 3, the thin portion 31 is provided with a positioning projection 32 engaging with a depression portion 41 which is provided in the presser plate 4, and depression portions 121 and 121 which are provided in the case member 1.

The positioning projection 32 is structured such that two are provided in the side (the lower side of the drawing) coming into contact with the key pad side case member 12, and one is provided in the side (the upper side of the drawing) coming into contact with the presser plate 4, however, may be structured as long as one or more exists in any side.

In accordance with this, since it is easy to assemble, and it is possible to precisely position the gasket 3, it is possible to achieve a good sealing performance.

Further, as shown in FIG. 3, the projection portion 30 of the gasket 3 is pressed between the key pad side case member 12 and the presser plate 4, and is deformed into a flat shape.

The presser plate 4 is firmly fixed to the case member 1 side by a screw means, a snap means or the like, for pinching the gasket 3 in a state of crimping it with respect to the case member 1.

Further, in the embodiment shown in FIG. 2, the presser plate 4 is structured such as to pinch the gasket 3 from an outer side of the case member 1.

Accordingly, it is possible to easily carry out an assembling and a disassembling.

Figure 6:
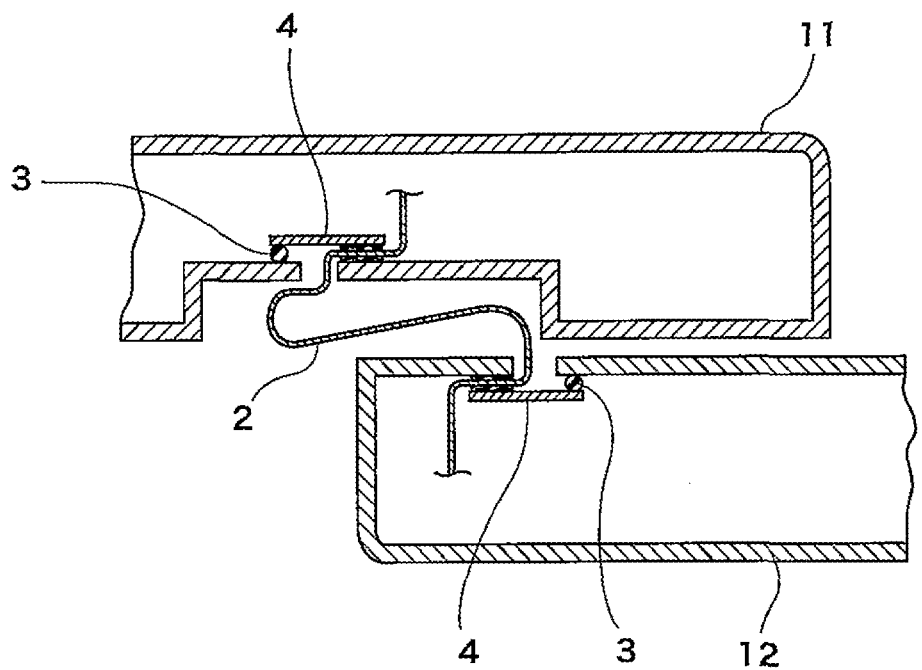
FIG. 6 is a view showing an aspect that a presser plate exists in an inner portion of a case member in the same manner as FIG. 2.

Further, in order to effectively achieve a thin structure of an electronic equipment, the presser plate 4 may be structured, as shown in FIG. 6, such that the gasket 3 is pinched from an inner side of the case member 1.

Figure 7:
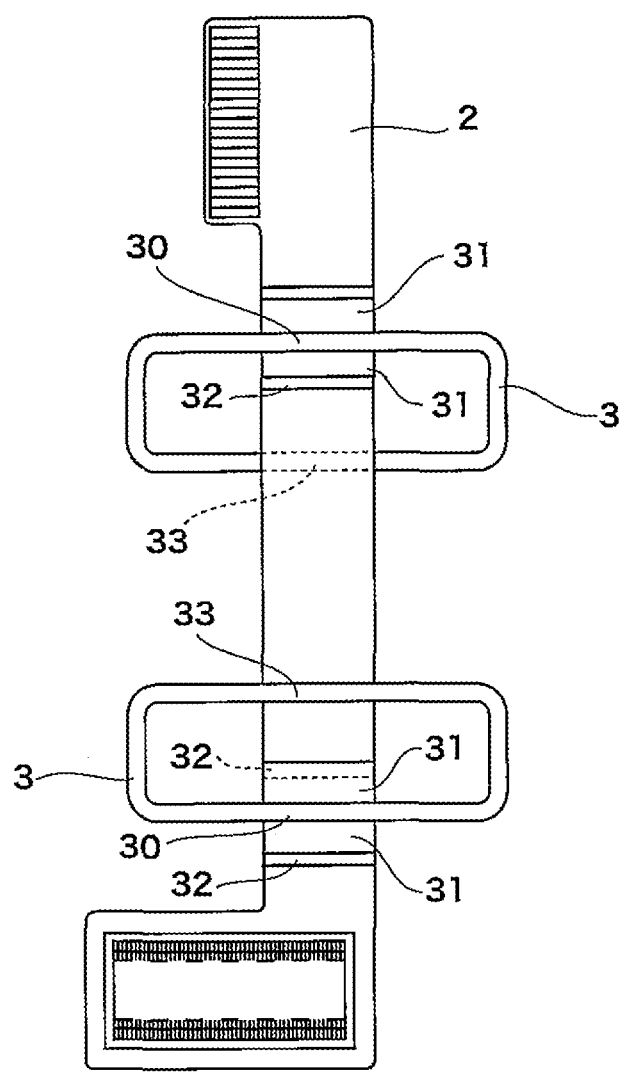
FIG. 7 is a plan view showing a state in which a gasket used in FIG. 6 is integrally formed in a flexible wiring board.

The gasket 3 is structured as shown in FIG. 7.

A difference point from the aspect shown in FIG. 4 is a point that the positions at which two annular gaskets 3 and 3 made of the rubber elastic material are integrally formed on the surface of the flexible wiring board 2 exit at positions (positions which are away to an upper side and a lower side of the drawing) which are away from each other.

Further, in the same manner as the aspect in FIG. 4, one of the portion which is seen so as to lap over the flexible wiring board 2 of the gasket 3 comes to the non-adhered positions 33 and 33 in a state in which they are not adhered to the flexible wiring board 2. The non-adhered positions 33 and 33 are different from the aspect shown in FIG. 4, and exist at the positions which are close to each other.

Accordingly, in the same manner as the aspect in FIG. 4, it is possible to pinch the gasket between the case member 1 and the presser plate 4 in a state in which the flexible wiring board 2 is inserted to the through hole 10.

A material of the gasket 3 can employ various rubber elastic materials such as an urethane rubber, a silicone rubber, a fluorine-contained rubber, a natural rubber and the like, however, a self-adhering liquid rubber is preferable in the light of an adhesive property and a molding property.

Further, a material of the presser plate 4 can be employed by appropriately selecting from a metal plate, a resin plate and the like, and can be previously integrated with the gasket 3.

Further, the present invention is not limited to the best mode for carrying out the invention mentioned above, but can of course employ the other various structures without deviating from the scope of the present invention.

What is claimed is:

1. A seal structure for an electronic equipment which seals a gap between a flexible wiring board inserted to a through hole provided in a case member of the electronic equipment and said through hole, the seal structure comprising:

an annular gasket which is integrally formed on a part of said flexible wiring board and is made of a rubber elastic material; and a presser plate which pinches said gasket with respect to said case member, wherein a seal projection portion of said gasket continuously exists on both surfaces of said flexible wiring board including a region in which said gasket is integrally formed on said flexible wiring board.

2. The seal structure as claimed in claim 1, wherein a thin portion extending from said gasket is integrally formed on said flexible wiring board in the region in which said gasket is integrally formed on said flexible wiring board.

3. The seal structure as claimed in claim 2, wherein said thin portion is provided with a positioning projection which engages with a depression portion provided in said presser plate or said case member.

* * * * *